United States Patent
Campbell-Brown et al.

(10) Patent No.: US 10,086,620 B2
(45) Date of Patent: Oct. 2, 2018

(54) FLEXIBLE SUBSTRATE WITH INTEGRATED CIRCUIT

(71) Applicant: HEWLETT-PACKARD DEVELOPMENT COMPANY, L.P., Houston, TX (US)

(72) Inventors: Iain Campbell-Brown, Kildare (IE); Mark Walsh, Dublin (IE); John Oliver, Dublin (IE); Jefferson P. Ward, Brush Prairie, WA (US); Amy Shipman, Portland, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/842,469

(22) Filed: Dec. 14, 2017

(65) Prior Publication Data

US 2018/0104958 A1 Apr. 19, 2018

Related U.S. Application Data

(63) Continuation of application No. 14/863,902, filed on Sep. 24, 2015, which is a continuation of application No. 14/375,856, filed as application No. PCT/US2012/035889 on Apr. 30, 2012, now Pat. No. 9,162,469.

(51) Int. Cl.
*B41J 2/175* (2006.01)

(52) U.S. Cl.
CPC ......... *B41J 2/17543* (2013.01); *B41J 2/1753* (2013.01); *B41J 2/17513* (2013.01); *B41J 2/17546* (2013.01); *B41J 2/17553* (2013.01); *H01L 2224/97* (2013.01)

(58) Field of Classification Search
CPC ... B41J 2/17526; B41J 2/17546; B41J 2/1753
See application file for complete search history.

(56) References Cited

U.S. PATENT DOCUMENTS

| 4,872,027 A * | 10/1989 | Buskirk ............... B41J 2/2132 346/139 C |
| 5,610,635 A | 3/1997 | Murray et al. |
| 5,963,427 A | 10/1999 | Bollesen |

(Continued)

FOREIGN PATENT DOCUMENTS

| CN | 1257446 | 6/2000 |
| CN | 1529657 | 9/2004 |

(Continued)

OTHER PUBLICATIONS

International Search Report and Written Opinion, dated Dec. 14, 2012. PCT Patent Application No. PCT/US2012/035889, Korean IPO.

*Primary Examiner* — John P Zimmermann
(74) *Attorney, Agent, or Firm* — HP Inc. Patent Department

(57) ABSTRACT

In one example, a flexible circuit for a fluid cartridge includes a single flexible substrate, an integrated circuit connected to the single flexible substrate, and an electrical connector pad array arranged in a constant pattern on the single flexible substrate for connection to a host controller. The electrical connector pad array includes first electrical connector pads connected to the integrated circuit and second electrical connector pads for connection to a fluid dispensing die.

19 Claims, 5 Drawing Sheets

(56) References Cited

U.S. PATENT DOCUMENTS

| | | |
|---|---|---|
| 6,053,598 A | 4/2000 | Inpyn |
| 6,116,717 A | 9/2000 | Anderson et al. |
| 6,137,508 A | 10/2000 | Gaarder |
| 6,174,046 B1 | 1/2001 | Reid et al. |
| 6,212,505 B1 * | 4/2001 | Herbert ............... B41J 2/17543 705/408 |
| 6,227,643 B1 | 5/2001 | Purcell et al. |
| 6,328,415 B1 * | 12/2001 | Norton ................. B41J 25/304 347/37 |
| 6,357,864 B1 | 3/2002 | Sullivan et al. |
| 6,375,298 B2 | 4/2002 | Purcell et al. |
| 6,533,396 B2 | 3/2003 | Chen et al. |
| 6,536,871 B1 | 3/2003 | Haddick et al. |
| 6,565,198 B2 | 5/2003 | Saruta et al. |
| 6,655,775 B1 | 12/2003 | Raman et al. |
| 6,692,116 B2 | 2/2004 | Pan et al. |
| 6,827,420 B2 * | 12/2004 | Campbell ............. B41J 29/393 283/70 |
| 6,866,359 B2 | 3/2005 | Pan et al. |
| 7,025,440 B2 | 4/2006 | Graf et al. |
| 7,631,953 B2 | 12/2009 | Bergstedt et al. |
| 7,658,470 B1 | 2/2010 | Jones et al. |
| 8,109,610 B2 | 2/2012 | Toge et al. |
| 8,662,639 B2 | 3/2014 | Doran |
| 8,721,203 B2 | 5/2014 | Ehrhardt, Jr. |
| 2004/0141019 A1 | 7/2004 | Schloeman et al. |
| 2004/0189758 A1 | 9/2004 | Alexia et al. |
| 2006/0125893 A1 | 6/2006 | Lee et al. |
| 2007/0081842 A1 | 4/2007 | Ehrhardt, Jr. |
| 2007/0229595 A1 | 10/2007 | Bergstedt et al. |

FOREIGN PATENT DOCUMENTS

| | | |
|---|---|---|
| CN | 1785676 | 6/2006 |
| CN | 201703033 | 1/2011 |
| CN | 102300713 | 12/2011 |
| CN | 104066585 | 9/2014 |
| WO | WO-96/05061 | 2/1996 |
| WO | WO-03/016063 | 2/2003 |
| WO | WO-2010/087857 | 8/2010 |

* cited by examiner

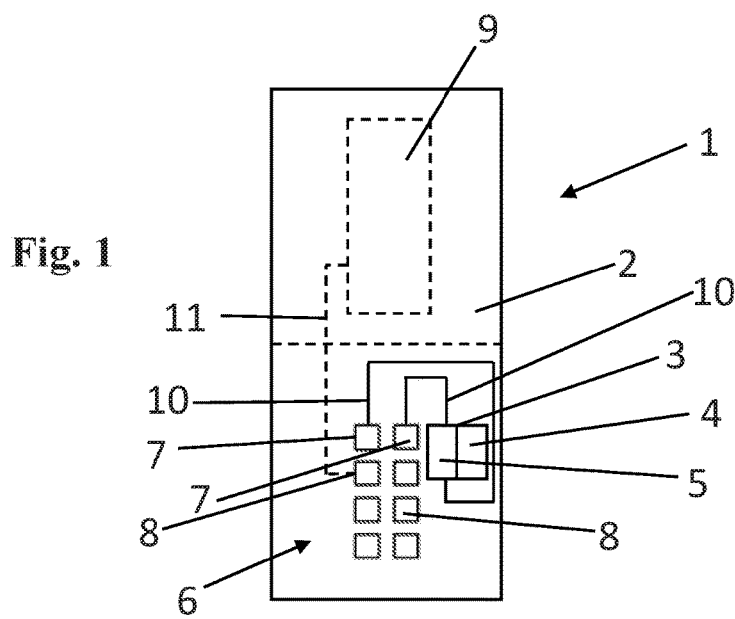
Fig. 1
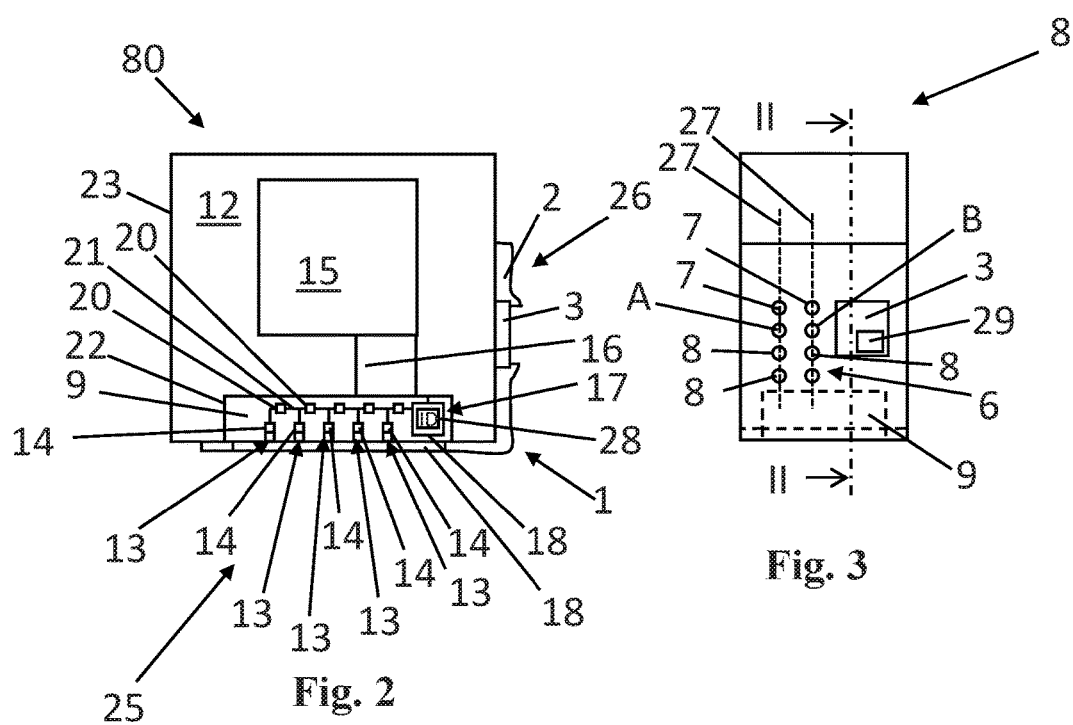
Fig. 2
Fig. 3

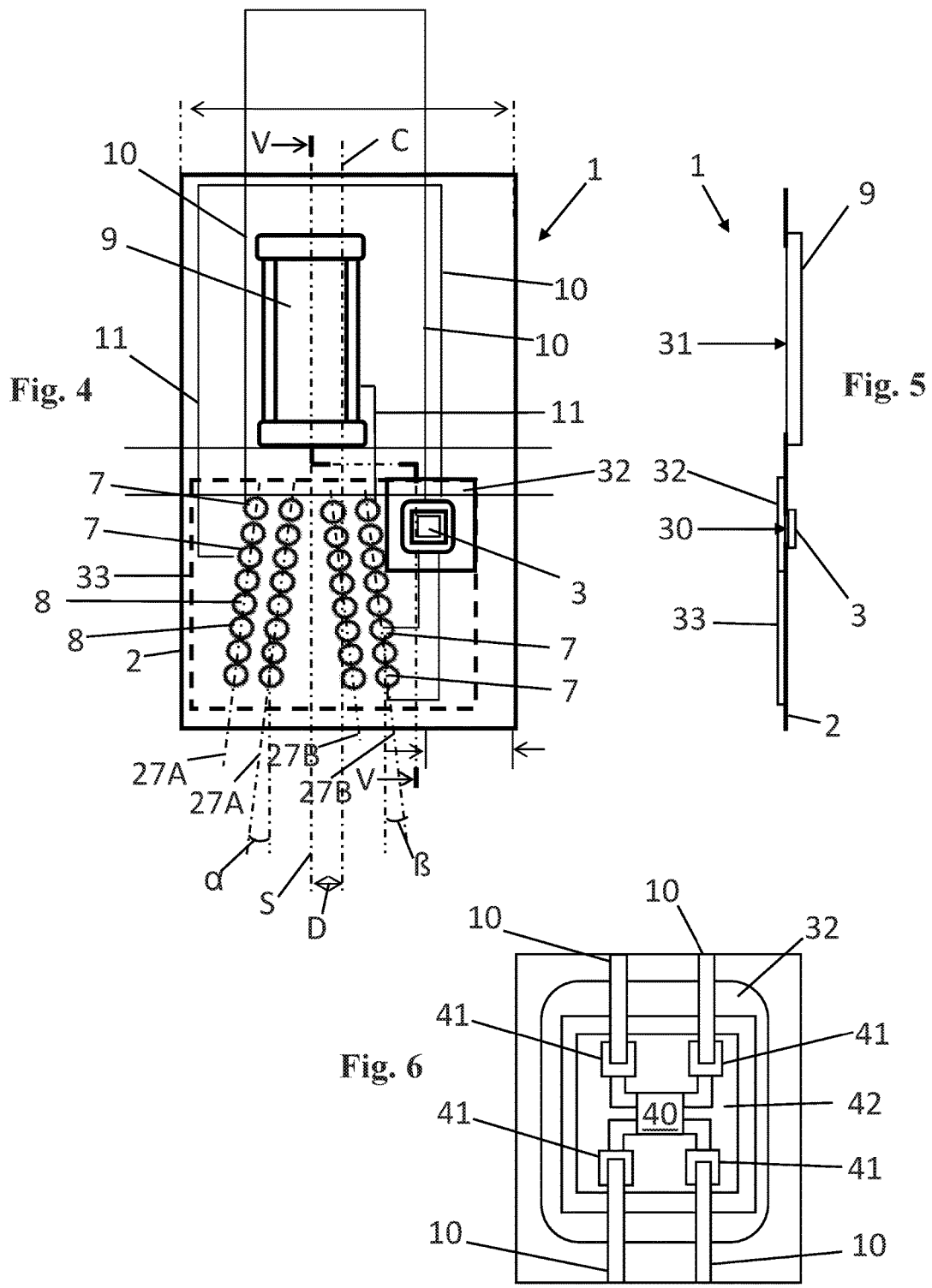

FLEXIBLE SUBSTRATE WITH INTEGRATED CIRCUIT

CROSS-REFERENCE TO RELATED APPLICATIONS

This application is a continuation of co-pending U.S. application Ser. No. 14/863,902, filed Sep. 24, 2015, which is a continuation of U.S. application Ser. No. 14/375,856, filed Jul. 31, 2014 (now U.S. Pat. No. 9,162,469), which is itself a 35 U.S.C. 371 national stage filing of International Application serial no. PCT/US2012/035889, filed Apr. 30, 2012, each of which are incorporated by reference herein in their entireties.

BACKGROUND

Examples of fluid cartridges are ink cartridges provided with integrated fluid dispensing dies. The fluid dispensing dies are provided with nozzles and actuators. The actuators can be signaled for fluid dispensing through a control circuit in a host device. When the cartridge is installed in the printer, the electrical connector pad array is connected to corresponding connector pads of the printer, so that a printer controller can signal the die circuit and the actuators, and fluid can be dispensed on a medium in accordance with input digital image data. The electrical connector pad array and the fluid dispensing die are attached to a flexible circuit. In industry, such flexible circuit can also be referred to as tab flex, or tab head assembly. The flexible circuit oftentimes consists of a flexible film, a window for the fluid dispensing die, the fluid dispensing die, electrical connector pads, and conductor lines connecting the connector pads to the actuators. It can be challenging to integrate further functionalities with the flexible circuit in a cost efficient manner.

BRIEF DESCRIPTION OF THE DRAWINGS

For the purpose of illustration, certain examples constructed in accordance with the teachings of this disclosure will now be described with reference to the accompanying drawings, in which:

FIG. 1 illustrates a diagram of an example of a flexible circuit;

FIG. 2 illustrates a diagram of an example of a cross sectional side view of a fluid cartridge;

FIG. 3 illustrates a diagram of a front view of the example of the fluid cartridge of FIG. 2;

FIG. 4 illustrates a diagram of top view of another example of a flexible circuit;

FIG. 5 illustrates a diagram of an example of a cross sectional side view of the flexible circuit of FIG. 4;

FIG. 6 illustrates a diagram of a portion of the example of the flexible circuit of FIG. 4;

DETAILED DESCRIPTION

Figure 7:
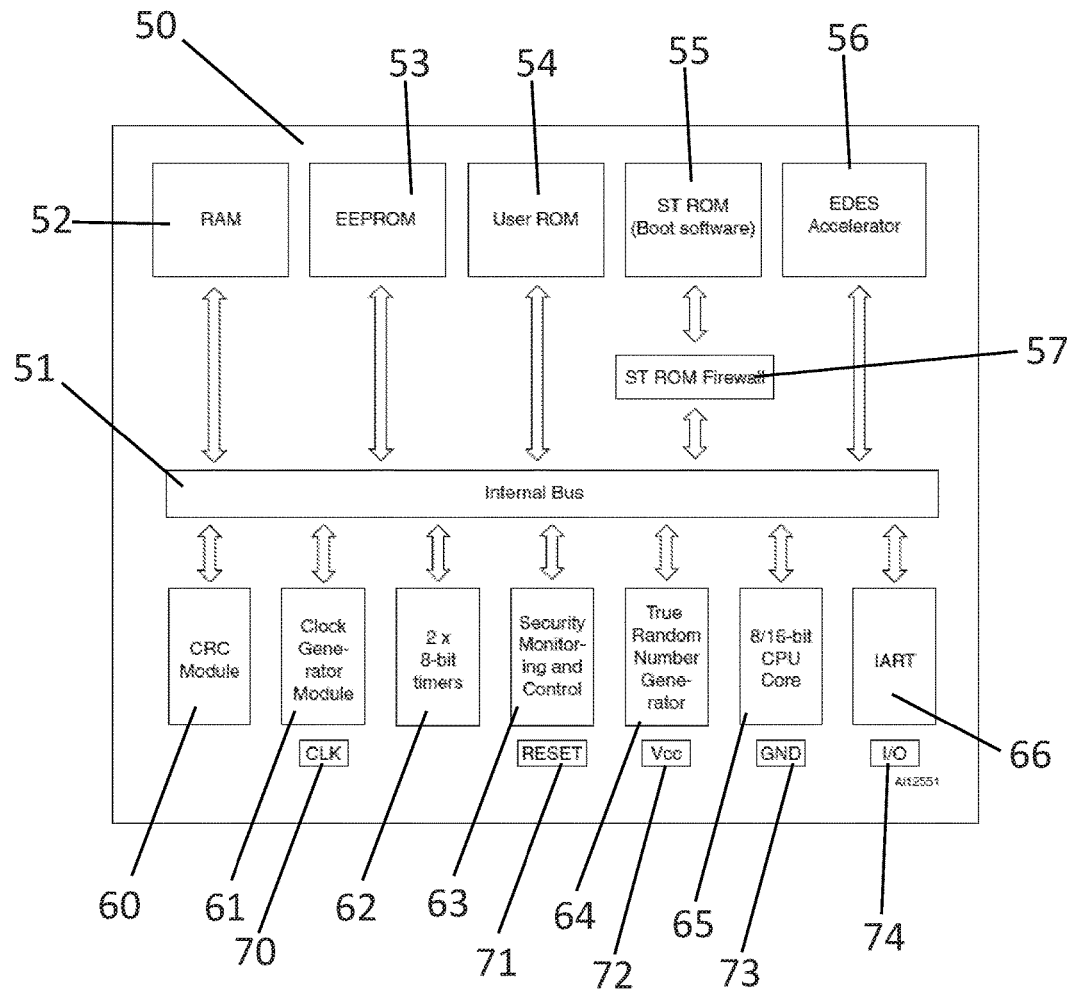
FIG. 7 illustrates a block diagram of an example of a secure microcontroller.

In the following detailed description, reference is made to the accompanying drawings. The examples in the description and drawings should be considered illustrative and are not to be considered as limiting to the specific example or element described. Multiple examples may be derived from the following description and/or drawings through modification, combination or variation of certain elements. Furthermore, it may be understood that examples or elements that are not literally described may be derived from the description and drawings by a person of ordinary skill in the art.

FIG. 1 illustrates a diagram of an example of a flexible circuit 1. For example the flexible circuit 1 is arranged to be applied to a fluid cartridge 80 (FIG. 2, 3). For example, the flexible substrate 2 consists of a single integrated substrate, for example a single flexible film. For example, the flexible substrate 2 is cut out of a single continuous flexible film. The flexible circuit 1 further includes a first integrated circuit 3 attached to the flexible substrate 2. For example, the first integrated circuit 3 includes a memory 4 and a processing unit 5. The flexible circuit 1 includes an electrical connector pad array 6 arranged to receive signals from a host device, such as for example a printer or other fluid dispensing device. For example, other devices such as web servers or mobile communication devices can communicate with the first integrated circuit 3 through the printer or directly.

The example electrical connector pad array 6 is arranged in a constant pattern. For example, the electrical connector pad array 6 includes a number of connector pads regularly deposited on the flexible substrate 2 along parallel lines, as illustrated in FIG. 1. For example the electrical connector pad array 6 is equal or similar to a conventional electrical connector pad array 6, for example as known from existing fluid cartridge connector pad arrays. The electrical connector pad array 6 includes first electrical connector pads 7 connected to the first integrated circuit 3 and second electrical connector pads 8 for connection to a fluid dispensing die 9. For example, the first electrical connector pads 7 are connected to first conductor lines 10 that are connected to the first integrated circuit 3. For example, the second electrical connector pads 8 are connected to second conductor lines 11 for connection to the fluid dispensing die 9. For example, bond pads connect the first and second conductor lines 10, 11 to the first integrated circuit 3 and the fluid dispensing die 9, respectively. In an example, the bond pads are conductive joints that can be connected to respective leads through gang bonding or other bonding techniques. For example, separate joints are formed on the bond pads or connector pads 7, 8, or the bond pads or connector pads 7, 8 act as joints.

For example, the fluid dispensing die 9 includes at least one of actuators, nozzles, slots and a second integrated circuit. The second electrical connector pads 8 are connected to at least one of these actuators, nozzles, slots, and second integrated circuit through the second conductor lines 11.

In an example, the flexible circuit 1 of FIG. 1 allows for gang bonding of the features on the flexible substrate 2. For example, the electrical connector pads 7, 8 and the conductor lines 10, 11 are connected by gang bonding. For example, the first integrated circuit 3 and the fluid dispensing die 9 are connected to the corresponding conductor lines 10, 11, respectively, by gang bonding. For example, the integrate circuit 3 can be gang bonded to the flexible substrate 2 with the same gang bonding tool, on the same gang bond table, and in the same gang bonding process step as the electrical connector pad array 6 and die 9, to allow for manufacturing with relatively cost efficient tools and processes.

FIGS. 2 and 3 illustrate a diagram of a cross sectional side view and a front view, respectively, of a fluid cartridge 80.

FIG. 2 represents a cross sectional side view of FIG. 3. The dimensions in FIGS. 2 and 3 are strongly exaggerated for reasons illustration. The fluid cartridge 80 of FIGS. 2 and 3 includes a housing 23 and the flexible circuit 1 attached to the housing 23. In FIGS. 2 and 3 the flexible circuit 1 is mounted to the cartridge 80 but it should be understood that in an example the flexible circuit 1 is a product in itself, for example an intermediary product, separate from the fluid cartridge 80. The housing 23 includes a fluid reservoir 12. For example, the housing 23 includes a single cast mold and a lid or shell for tapping or closing the reservoir 12. The flexible circuit 1 includes the flexible substrate 2 and connected to it the first integrated circuit 3 and the fluid dispensing die 9. For example, the fluid cartridge 80 (FIG. 2, 3) is an ink cartridge with integrated printhead. For example, the fluid dispensing die 9 is a printhead die. For example, the actuators are at least one of thermal and piezo resistors for jetting ink.

The illustrated example of FIGS. 2 and 3 includes a single chamber reservoir 12. In another example, the fluid cartridge 80 includes multiple reservoir chambers for different fluids, for example different colors of ink, separated by inner walls. For example at least one capillary medium 15 and at least one standpipe 16 are provided in the reservoir 12, for example one capillary medium 15 and standpipe 16 per chamber, for providing the fluid to the fluid dispensing die 9. In the illustrated example, the fluid cartridge 80 includes a bed 22 or frame that can be pre-molded in the housing 23, for receiving and connecting the fluid dispensing die 9 to the housing 23. In an example, the fluid dispensing die 9 is connected with the flexible substrate 2 before being attached to the housing 23.

The fluid dispensing die 9 includes nozzles 13 and actuators 14. For example, the actuators 14 include thermal or piezo resistors for ejecting fluid from chambers. A second integrated circuit 17 is provided that is connected to, for example included in, the fluid dispensing die 9. In an example the second integrated circuit 17 includes a second memory 18. In an example, the second integrated circuit 17 includes at least one transistor 20, for example to facilitate triggering of the actuators 14. For example, the fluid dispensing die 9 includes conductor circuits 21 for connecting the different circuits. For example, the conductor circuits 21 connect the actuators 14 to the second integrated circuit 17 and to the electrical connector pad array 6, for example to facilitate triggering of the actuators 14 by a host device controller. In the illustrated example, the second integrated circuit 17 is arranged at a distance from the first integrated circuit 3. For example, the second integrated circuit 17 is arranged in or near the fluid dispensing die 9, near a bottom 25 of the fluid cartridge 80, and the first integrated circuit 3 is arranged near the electrical connector pad array 6, for example at a front 26 of the fluid cartridge 80. For example the second integrated circuit 17 is integrated with the fluid dispensing die 9. For example, the second integrated circuit 17 is fabricated in JetMos Integrated Circuit fabrication processes, wherein also the die 9 including the transistors 20 and the memory 18 can be fabricated. For example, the memory 18 includes at least one of a Read Only Memory (ROM), a series of links, and an Erasable Programmable Read-Only Memory (EPROM), for example having a limited memory of approximately 200 bits or less, or of approximately 400 bits or less, or of approximately 2048 bits or less, or more.

For example, a cartridge ID 28 is stored on the memory 18 of the second integrated circuit 17. For example, the cartridge ID 28 includes a part of a unique serial number pertaining to the cartridge 80. For example, the cartridge ID 28 includes a code that corresponds to a further ID such as the serial number. For example the cartridge ID 28 includes a hash, an encrypted code or an obfuscated version of a further ID such as the serial number. For example, the cartridge ID 28 stored on the second integrated circuit 17 is secured using an industry standard security coding method. For example, the host device controller is configured to decode or otherwise process the cartridge ID 28 for verification.

For example, an authentication code 29 is stored on the memory 4 of the first integrated circuit 3. For example, the authentication code 29 corresponds to said cartridge ID 28 stored on the second integrated circuit 17, so that the ID stored on the second integrated circuit 17 and the authentication code 29 stored on the first integrated circuit 3 can be matched, for example by a host device controller. In one example, the cartridge ID 28 and the authentication code 29 are equal and can be directly matched. In another example, one or both of the cartridge ID 28 and the authentication code 29 needs to be processed before being able to match the cartridge ID 28 and the authentication code 29. For example, the authentication code 29 is secured, for example encrypted. For example the authentication code 29 is a secret key. For example, the authentication code 29 includes a hash, an encrypted code or an obfuscated version of the cartridge ID 28 or of a further ID such as the serial number, so as to allow for said matching. For example, the host device controller is configured to decode or otherwise process the authentication code 29 for matching with the cartridge ID 28. Instead of, or in addition to the authentication code, the first integrated circuit 3 can container a further secret key for authentication.

In an example, the second integrated circuit 9 includes a hash of the cartridge ID 28. For example, the first integrated circuit 3 includes a hash of the authentication code 29. For example, a cryptographically signature is applied over one or both of the hashes with an asymmetric algorithm, for example using a private key. For example the private key is arranged according to at least one these techniques: RSA (Rivest, Shamir, Adleman), ECDSA (Elliptic Curve Digital Signature Algorithm) and DSA (Digital Signature Algorithm). For example, the signature is stored in a tamper resistant memory, for example on the memory of the first integrated circuit 3. For example a host device can validate an authenticity of the cartridge 80 by reading the digital signature, the cartridge ID 28 and the authentication code 29, and validate them using a public key which is already known to the host device.

As can be seen from FIGS. 2 and 3, in an example the first and second electrical connector pads 7, 8 form part of a single regularly patterned connector pad array 6. For example, the first and the second electrical connector pads 7, 8 are arranged long straight, parallel lines 27, for example in rows or columns. In an example that is not shown the lines 27 have an inclined orientation with respect to longitudinal edges of the flexible substrate 2. First and second electrical connector pads 7, 8 can be arranged along the same line 27. In the illustrated example, the electrical connector pad array 6 includes two parallel lines 27 of electrical connector pads 7, 8, each line including both first and second electrical connector pads 7, 8. One example of the flexible circuit 1 includes at least four first electrical connector pads 7 that are regularly arranged in the electrical connector pad array 6 that are connected to the first integrated circuit 3, for example including a ground connection, a power supply connection (Vcc), a data connection, and a clock circuit connection.

For example, the first integrated circuit 3 and the second integrated circuit 17 share at least one combination connector pad A, B. In this disclosure the combination connector pad A, B can be defined as a combination of both a first and a second electrical connector pad 7, 8. The combination connector pads A, B are electrically connected to the first and second conductor lines 10, 11. For example at least one combination connector pad A, B is configured to function as a ground for the first and second integrated circuit 3, 17, when connected to a host device. For example at least one combination connector pad A, B is configured to function as a power supply (Vcc) for the first and second integrated circuit 3, 17, when connected to the host device.

For example, having a constant pattern of electrical connector pads 7, 8 can allow for relatively cost efficient manufacturing of the flexible circuit 1, as well as the corresponding host device connectors. In an example, applying the first integrated circuit 3 to the flexible circuit 1 requires no modification, or only little modification, to existing flexible circuit fabrication.

FIGS. 4 and 5 illustrate a further example of a flexible circuit 1. The example flexible circuit 1 includes the fluid dispensing die 9. The example flexible circuit 1 includes the flexible substrate 2 and the first integrated circuit 3. The flexible substrate 2 includes a tape or film and flexible conductor lines 10, 11. For example, the flexible substrate 2 is made of strong polymer thin film material such as polyimide. The thin conductor lines 10, 11 are for example imaged by photolithography. In an example, the single flexible substrate 2 comprises at least one first window 30 and at least one second window 31. For example the first integrated circuit 3 is connected to the flexible substrate 2 near edges of the first window 30. For example, the fluid dispensing die 9 is connected to the flexible substrate 2 near edges of the second window 31 via bond pads and/or further joints. For example, the fluid dispensing die 9 and/or the first integrated circuit 3 are gang bonded or wire bonded to the flexible substrate 2 via bond pads. For example, the integrated circuit 3 is gang bonded to the first conductor lines 10, via first bond pads, and the fluid dispensing die 9 is gang bonded to the second conductor lines 11, via second bond pads. For example, the first integrated circuit 3 and the fluid dispensing die 9 are connected to the same side of the flexible substrate 2. For example the first integrated circuit 3 and the fluid dispensing die 9 are gang bonded on the same gang bond table, in one process step. In another example, the fluid dispensing die 9 and the first integrated circuit 3 are bonded in separate process steps wherein for example the flexible substrate 2 is repositioned or moved to another tool between these process steps.

For example, an encapsulation layer 32 encapsulates the first integrated circuit 3. For example, an encapsulation layer 33 encapsulates the electrical connector pad array 6. The illustrated example encapsulation layer 33 of the electrical connector pad array 6 also covers the first integrated circuit 3. The example encapsulation layer 33 illustrated defines one continuous encapsulation layer 33 for the connector pad array 6 and the first integrated circuit 3. In another example, multiple encapsulation islands 32 could be applied for encapsulating the first integrated circuit 3 and the electrical connector pad array 6 separately. For example, the encapsulation layers 32, 33 are made of the same material and applied to the same side of the flexible substrate 2. For example, the encapsulation layers 32, 33 are provided in the same manufacturing process step. For example, the encapsulation layer 32, 33 is configured to protect the respective encapsulated circuit 6, 3 from ink or other fluids. In an example, the encapsulation layer 32, 33 includes epoxy.

The example electrical connector pad array 6 of FIG. 4 illustrates first and second electrical connector pads 7, 8 along two pairs of parallel lines 27A, 27B. For example, the layout of the electrical connector pad array 6 is similar or equal to a conventional electrical connector pad array of a conventional flexible circuit of a fluid cartridge. For example, each line 27A, 27B has an inclination α, β with respect to sidewall of the flexible substrate 2, for example to facilitate the arrangement of conductor lines 10, 11 towards the first integrated circuit 3 and the fluid dispensing die 9. As can be seen from FIG. 4 lines 27A of a left pair of connector pad sub-arrays have a first inclination α and lines 27B of a right pair of connector pad sub-arrays have second inclination β. For example, the inclinations α, β are equal but in opposite directions.

For example, the first integrated circuit 3 is arranged between the electrical connector pad array 6 and a side edge of the single flexible substrate 2. For example, this facilitates locating the first integrated circuit 3 on the front face 26 of the fluid cartridge 80 (FIG. 2). For example, this facilitates readily encapsulating the electrical connector pad array 6 and the first integrated circuit 3. For example, the electrical connector pad array 6 is symmetrical having an axis of symmetry S through the middle of the electrical connector pad array 6, for example between the pairs of the connector pad sub-arrays. For example, the axis of symmetry S is arranged next to a center line C of the flexible substrate 2. The center line C extends through the center of the flexible substrate 2, parallel to the longitudinal side edges of the flexible substrate 2. In an example, a width W of the flexible substrate 2 is larger than a conventional width of a conventional type flexible circuit 1 of a similar fluid cartridge 80, for example the size of one flexible film's sprocket wider. For example the distance D between the axis of symmetry S of the electrical connector pad array 6 and the center line C of the flexible substrate 2 is approximately half of a sprocket pitch of the flexible film, or a multitude of half of a sprocket pitch of the flexible film. For example, the distance D between the center line C and the axis of symmetry S is approximately one, one-and-half, two, two-and-a-half, three, etc. times the sprockets' pitch.

FIG. 6 illustrates a top view of a diagram of an example of the first integrated circuit 3. For example the first integrated circuit 3 is a secure microcontroller. In the shown example the first integrated circuit 3 includes a main integrated circuit 40. Furthermore, at least four bond pads 41 are provided that connect the main integrated circuit 40 to the conductor lines 10. The bond pads 41 facilitate bonding of the integrated circuit 40 to the first conductor lines 10. For example, the first integrated circuit 3, the bond pads 41 and the first conductor lines 10 are gang bonded together. For example, at the gang bonding stage joints are formed between the conductor lines 10 and the bond pads 41. For example, the main integrated circuit 40 and the bond pads 41 are arranged on a relatively rigid substrate 42. For example, an encapsulation layer 32 encapsulates at least the main integrated circuit 40 and the bond pads 41. In an example, at least one or at least two of the bond pads 41 are connected to combination electrical connector pads A, B (FIG. 2).

In an example, the first integrated circuit 3 includes a secure microcontroller 50. FIG. 7 illustrates a diagram of an example of a secure microcontroller 50. For example, the secure microcontroller 50 includes memory elements connected to an internal bus 51 such as at least one of a RAM 52, an EEPROM 53, a User ROM 54, and a ST ROM (Boot Software) 55. For example, the secure microcontroller 50 includes an EDES accelerator 56 connected to the internal bus 51. For example a ST ROM Firewall 57 is provided between the ST ROM 55 and the internal bus 51. For example, the secure microcontroller 50 includes processing modules that communicate with the internal bus 51, such as at least one of a Cyclic Redundancy Check (CRC) module 60, a Clock Generator Module 61, two times 8-bit timers 62, a Security Monitoring and Control circuit 63, a True Random Number Generator 64, an 8/16-bit Central Processing Unit Core 65 and an Asynchronous Receiver Transmitter (IART) 66 for high speed serial data support. For example, further circuits on the secure microcontroller 50 include a Clock Circuit 70 (CLK), a reset circuit 71, a power supply or Vcc circuit 72, a ground circuit 73, and an Input/Output circuit 74. In an example the Vcc circuit 72 and the ground circuit 73 are connected to the combination electrical connector pads A, B through conductor lines 10, wherein the combination electrical connector pads A, B are also connected to the second integrated circuit 17. For example, other circuits such as the Clock Circuit 70 or the Input/Output circuit 74 can be unique to the secure microcontroller 50 and are not shared with the fluid dispensing die 9.

For example, instead of or in addition to the secure micro controller, the first integrated circuit 3 includes another secure memory.

For example the secure microcontroller 50 is configured to facilitate secure authentication. For example, in addition to the authentication code 29, the secure microcontroller 50 stores further data for example including at least one of an ink level, reward-related data, coupon or voucher related data, website addresses, image data, a set of instructions for the printer, etc. The secure microcontroller 50 can be co-gang bonded to the flexible substrate 2 together with the fluid dispensing die 9.

Figure 8:
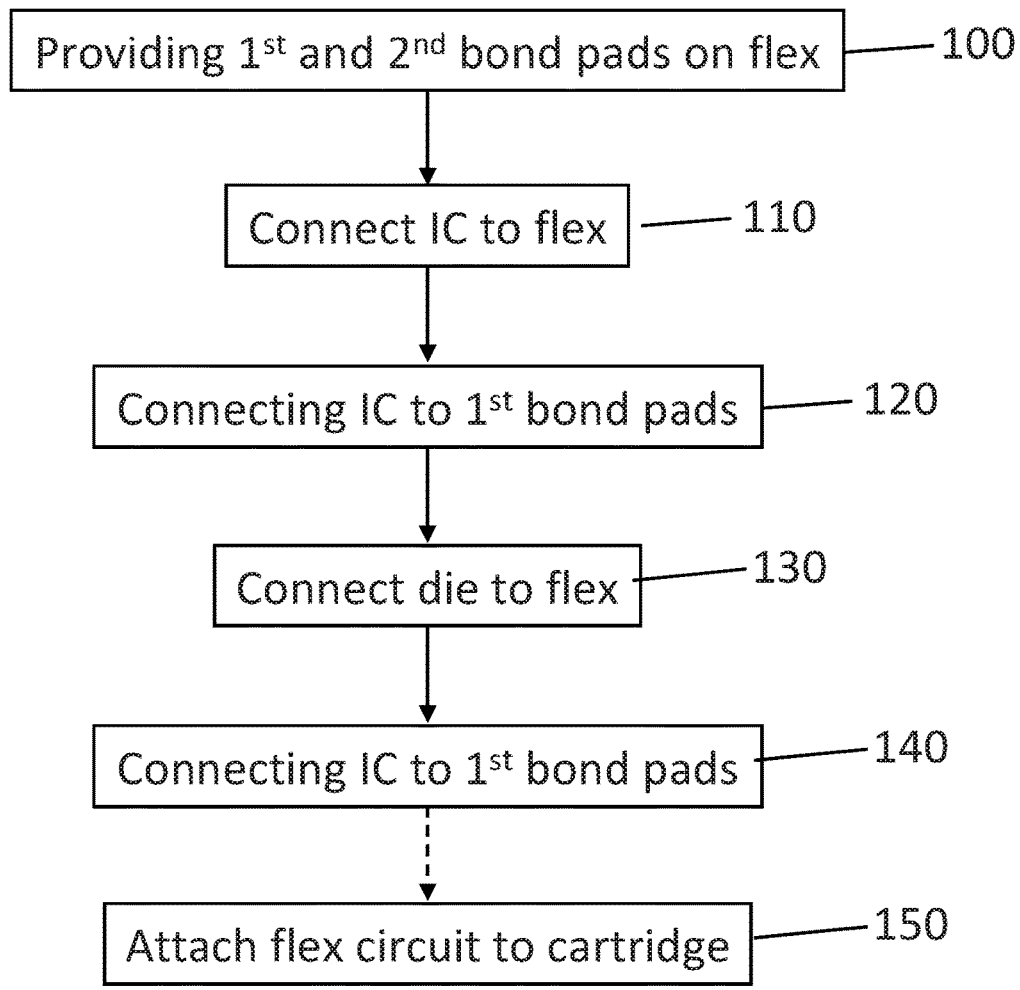
FIG. 8 illustrates a flow chart of an example of a method of manufacturing a flexible circuit.

FIG. 8 illustrates an example of a method of manufacturing a flexible circuit 1 for a fluid dispensing cartridge 80. The example method includes providing the constant array 6 of the first and second electrical connector pads 7, 8 on a flexible substrate 2 (block 100). For example, the method includes connecting the first integrated circuit 3 to the flexible substrate 2 (block 110). For example the first integrated circuit 3 is bonded to the flexible substrate 2, for example gang bonded, for example via first bond pads 41 provided on the substrate 2. The first bond pads 41 connect to the first conductor lines 10. The example method includes connecting the first integrated circuit 3 (or the first bond pads 41) to the first electrical connector pads 7 of the array 6 (block 120). For example, the first integrated circuit 3 includes a secure microcontroller 50 configured to facilitate secure authentication of a fluid cartridge 80. The example method includes connecting the fluid dispensing die 9 to the flexible substrate 2 (block 130), at a distance from the first integrated circuit 3. For example the fluid dispensing die 9 is bonded to the flexible substrate 2, for example gang bonded, for example via bond pads 41 provided on the substrate 2, and for example in one step together with the integrated circuit 3. The second bond pads are connected to the second conductor lines 11. For example, the method includes connecting the second electrical connector pads 8 to the fluid dispensing die 9 (block 140), for example to a second integrated circuit 17 thereof. For example, the method includes attaching the resulting flexible circuit 1 to the fluid cartridge 80 (block 150) so that the fluid dispensing die 9 is fluidically connected to fluid reservoir 12 and the electrical connector pad array 6 extends on the front face 26.

Figure 9:
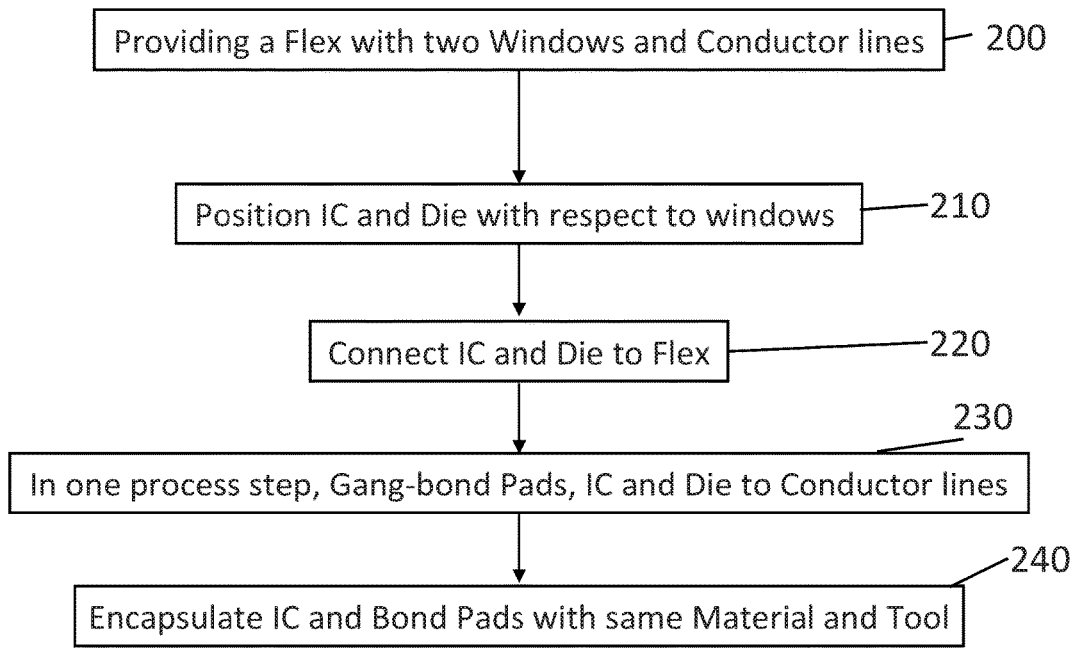
FIG. 9 illustrates a flow chart of another example of a method of manufacturing a flexible circuit.

FIG. 9 illustrates another example of a method of manufacturing a flexible circuit 1 for a fluid dispensing cartridge 80. For example, the method includes providing the flexible substrate 2, the flexible substrate 2 comprising at least the first window 30 for the first integrated circuit 3 and the second window 31 for the fluid dispensing die 9 and pre-arranged conductor lines 10, 11 (block 200). In an example, the flexible substrate 2 is pre-manufactured by a third party. For example, the dimensions and locations of the circuits of the flexible circuit 1 are predetermined and determine the dimensions and configuration of the flexible substrate 2. For example, the conductor lines 10, 11 are pre-arranged for connecting the die 9 and the first integrated circuit 3 to the respective electrical connector pads 7, 8.

For example, the example method of FIG. 9 includes positioning the die 9 and the first integrated circuit 3 with respect to the corresponding windows 30, 31 (block 210), and for example connecting the die 9 and the first integrated circuit 3 to the flexible substrate 2 (block 220). For example, one or a combination of wire and gang bonding is used to connect the die 9 and the first integrated circuit 3 to the flexible substrate 2. For example, the method includes gang bonding the first integrated circuit 3, the die 9 and the first and second electrical connector pads 7, 8 to the corresponding conductor lines 10, 11 (block 230). For example, one gang bonding tool is used to gang bond the respective connector pads 7, 8 and bond pads 41 to the conductor lines 10, 11. The gang bonding process allows for making multiple electrical contacts in one process step. For example, the electrical connector pads 7, 8 and the first integrated circuit 3 are encapsulated using the same encapsulation material, for example using the same tool, and for example in the same process step (block 240), for example without moving the flexible substrate 2 with respect to the bond table. In another example, the die 9 and the first integrated circuit 3 are bonded in separate process steps, for example the flexible substrate 2 is repositioned after one of the die 9 or first integrated circuit 3 is bonded. For example different bonding tools or tables are used for bonding the die 9 and the first integrated circuit 3.

Figure 10:
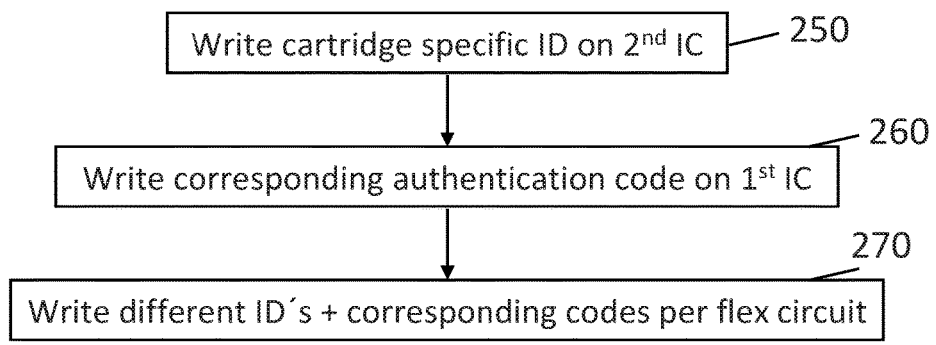
FIG. 10 illustrates a flow chart of a part of a further example of a method of manufacturing a flexible circuit.

FIG. 10 illustrates another example of a method of manufacturing a flexible circuit 1 for a fluid dispensing cartridge 80. For example, the method includes writing a cartridge ID 28 on the second integrated circuit 17 (block 250). For example, the method includes writing an authentication code 29 corresponding to the cartridge ID 28 on the first integrated circuit 3 (block 260). For example, the method includes writing different cartridge ID 28s and different corresponding authentication codes 29 per flexible circuit 1 or per fluid cartridge 80 (block 270), so that each fluid cartridge 80 has a unique ID 28 and authentication code 29. For example, the latter step provides for a secured and unique authentication code 29 per fluid cartridge 80.

For example, some of the features disclosed in this specification provide for the ability to securely authenticate a flexible circuit 1 or fluid cartridge 80, while allowing for an integrated and cost efficient manufacturing thereof. For example, the integrated circuit 3 is configured to facilitate secure authentication. In different examples, different host devices are able to authenticate the flexible circuit 1 or fluid cartridge 80, for example a printer, smart phone, a web server, any computing device, etc. In an example the host device interfaces with the flexible circuit 1 through the printer. In an example, the first integrated circuit 3 is configured to store further data such as fluid related codes, color adjustment information, voucher related codes, advertisements, coupons, etc. For example, the host device can access, modify or process such further data only after the secure authentication has been established through the first integrated circuit 3. For example, the first integrated circuit 3 is configured to provide, or provide access to, above mentioned further data only after the authentication is established. In an example, the fluid dispensing die 9 needs little or no adaptations with respect to existing integrated printheads. In another example, the flexible substrate 2 and electrical connector pad array 6 need little or no adaptations with respect to existing electrical connector pad arrays of integrated printhead fluid cartridges. For example, the integrated circuit 3 is gang bonded to conductor lines 10 at the same time as the fluid dispensing die 9, at a distance from the fluid dispensing die 9, and to the same flexible substrate 2.

For example, the flexibility of the flexible circuit 1 refers to the flexible substrate 2 while some of the circuits on the flexible substrate 2 may in itself be relatively rigid. In fact, in an example the flexible circuit 1 can be relatively rigid due to the circuits on the flexible substrate 2. For example, in addition to or instead of gang bonding, wire bonding or other suitable welding methods can be used, for example including the use of heating processes, electrical energy or chemical components.

In one example, the fluid cartridge 80 is adapted to be connected to a host device. In another example, the fluid cartridge 80 is part of a handheld fluid dispensing device. In yet another example, the fluid dispensing device or host device is a printer or titration device or another type of high precision fluid dispensing device.

The above description is not intended to be exhaustive or to limit this disclosure to the examples disclosed. Other variations to the disclosed examples can be understood and effected by those of ordinary skill in the art from a study of the drawings, the disclosure, and the claims. The indefinite article "a" or "an" does not exclude a plurality, while a reference to a certain number of elements does not exclude the possibility of having more or less elements. A single unit may fulfil the functions of several items recited in the disclosure, and vice versa several items may fulfil the function of one unit. Multiple alternatives, equivalents, variations and combinations may be made without departing from the scope of this disclosure.

What is claimed is:

1. A flexible circuit for a fluid cartridge, comprising
a single flexible substrate;
an integrated circuit connected to the single flexible substrate; and
an electrical connector pad array arranged in a constant pattern on the single flexible substrate for connection to a host controller, the electrical connector pad array including first electrical connector pads connected to the integrated circuit and second electrical connector pads for connection to a fluid dispensing die.

2. The flexible circuit of claim 1, wherein the integrated circuit includes a secure microcontroller.

3. The flexible circuit of claim 1, wherein at least a portion of the first and the second electrical connector pads are arranged on one straight line.

4. The flexible circuit of claim 1, wherein:
the integrated circuit is arranged between the electrical connector pad array and a side edge of the single flexible substrate; and
an axis of symmetry of the electrical connector pad array is arranged parallel to and at a distance from a longitudinal center line of the single flexible substrate.

5. The flexible circuit of claim 1, comprising the fluid dispensing die and wherein the electrical connector pad array includes at least one electrical connector pad that is connected to both the integrated circuit and the fluid dispensing die.

6. The flexible circuit of claim 1, wherein the first electrical connector pads include at least four first electrical connector pads.

7. The flexible circuit of claim 1 comprising:
bond pads for connecting the integrated circuit to a conductor line connected to the electrical connector pads; and
an encapsulation layer covering the integrated circuit, the bond pads, and the electrical connector pad array.

8. The flexible circuit of claim 1, comprising the fluid dispensing die and wherein:
the single flexible substrate includes a first window and a second window;
the integrated circuit is connected to the single flexible substrate near edges of the first window; and
the fluid dispensing die is connected to the single flexible substrate near edges of the second window.

9. A fluid cartridge, comprising
a fluid reservoir;
a fluid dispensing die;
a single flexible substrate;
a first integrated circuit connected to the single flexible substrate;
an electrical connector pad array arranged in a constant pattern on the single flexible substrate for connection to a host controller, the electrical connector pad array including first electrical connector pads connected to the integrated circuit and second electrical connector pads connected to the fluid dispensing die;
a second integrated circuit connected to at least one of the second electrical connector pads, distanced from the first integrated circuit, connected to the fluid dispensing die, and configured to signal actuators in the fluid dispensing die;
a cartridge ID stored on the second integrated circuit; and
an authentication code stored on the first integrated circuit, the authentication code corresponding to the cartridge ID so that the cartridge ID and the authentication code can be matched by the host controller.

10. A fluid cartridge comprising
a flexible substrate;
an integrated circuit connected to the flexible substrate;
a fluid dispensing die connected to the same flexible substrate as the integrated circuit; and
a constant electrical connector pad array arranged on the same flexible substrate as the integrated circuit and the fluid dispensing die, for connection to a host controller, the electrical connector pad array including first electrical connector pads connected to the integrated circuit and second electrical connector pads connected to actuators in the fluid dispensing die.

11. A method of manufacturing a flexible circuit for a fluid cartridge, comprising
providing a constant array of first and second electrical connector pads on a flexible substrate;
connecting an integrated circuit to the flexible substrate;
connecting a fluid dispensing die to the flexible substrate;
connecting the integrated circuit to the first electrical connector pads; and connecting the fluid dispensing die to the second electrical connector pads.

12. The method of claim 11, comprising:
positioning the fluid dispensing die and the integrated circuit with respect to corresponding windows in the flexible substrate; and wherein
connecting the integrated circuit to the first electrical connector pads includes gang bonding the integrated circuit to first conductor lines on the flexible substrate; and
connecting the fluid dispensing die to the second electrical connector pads includes gang boding the fluid dispensing die to second conductor lines on the flexible substrate in the same process step with gang bonding the integrated circuit to the first conductor lines.

13. The method of claim 12, comprising encapsulating the electrical connector pads and the integrated circuit with the same material using the same encapsulation tool.

14. The method of claim 11, wherein the integrated circuit includes a secure microcontroller.

15. The method of claim 11, comprising:
writing a cartridge ID on the fluid dispensing die; and
writing an authentication code on the integrated circuit, the authentication code corresponding to the cartridge ID on the fluid dispensing die.

16. The cartridge of claim 9, wherein:
the first integrated circuit is arranged between the electrical connector pad array and a side edge of the single flexible substrate; and
an axis of symmetry of the electrical connector pad array is arranged parallel to and at a distance from a longitudinal center line of the single flexible substrate.

17. The cartridge of claim 9, wherein the electrical connector pad array includes at least one electrical connector pad that is connected to both the integrated circuit and the fluid dispensing die.

18. The cartridge of claim 10, wherein:
the integrated circuit is arranged between the electrical connector pad array and a side edge of the flexible substrate; and
an axis of symmetry of the electrical connector pad array is arranged parallel to and at a distance from a longitudinal center line of the flexible substrate.

19. The cartridge of claim 10, wherein the electrical connector pad array includes at least one electrical connector pad that is connected to both the integrated circuit and the fluid dispensing die.

* * * * *

UNITED STATES PATENT AND TRADEMARK OFFICE
CERTIFICATE OF CORRECTION

PATENT NO. : 10,086,620 B2
APPLICATION NO. : 15/842469
DATED : October 2, 2018
INVENTOR(S) : Iain Campbell-Brown et al.

Page 1 of 1

It is certified that error appears in the above-identified patent and that said Letters Patent is hereby corrected as shown below:

In the Claims

In Column 11, Line 11 approx., Claim 12, delete "boding" and insert -- bonding --, therefor.

Signed and Sealed this
Ninth Day of June, 2020

Andrei Iancu
*Director of the United States Patent and Trademark Office*